United States Patent [19]
Ipcinski

[11] Patent Number: 5,442,150
[45] Date of Patent: Aug. 15, 1995

[54] PIEZO ELECTRIC SWITCH

[76] Inventor: Ralph G. Ipcinski, 295 Silverlake Rd., Hollis, N.H. 03049

[21] Appl. No.: 116,495

[22] Filed: Sep. 7, 1993

[51] Int. Cl.⁶ .............................................. H01H 57/00
[52] U.S. Cl. .................... 200/181; 200/314; 310/339
[58] Field of Search ............ 200/181, 314, 310, 313, 200/520; 310/311, 339

[56] References Cited

U.S. PATENT DOCUMENTS

| | | | |
|---|---|---|---|
| 3,303,290 | 2/1967 | Suloway | 200/181 |
| 4,158,117 | 6/1979 | Quilliam et al. | 200/181 |
| 4,343,975 | 8/1982 | Sado | 200/314 |
| 4,618,797 | 10/1986 | Cline | 200/181 |

Primary Examiner—Henry J. Recla
Assistant Examiner—David J. Walczak

[57] ABSTRACT

The invention disclosed herein is directed at embodiments of a piezo electric switch having a combination of a lamp, a housing, a piezo element, a printed circuit board assembly, a lamp housing and a plunger and a second embodiment of a piezo electric switch having a combination of lamp element, a housing portion, a piezo film element, a bezel, a graphic overlay, a translucent diffuser backer, a connector being a laminate of layers of conductive and non conductive rubber, a printed circuit board assembly, and a lamp housing.

1 Claim, 13 Drawing Sheets

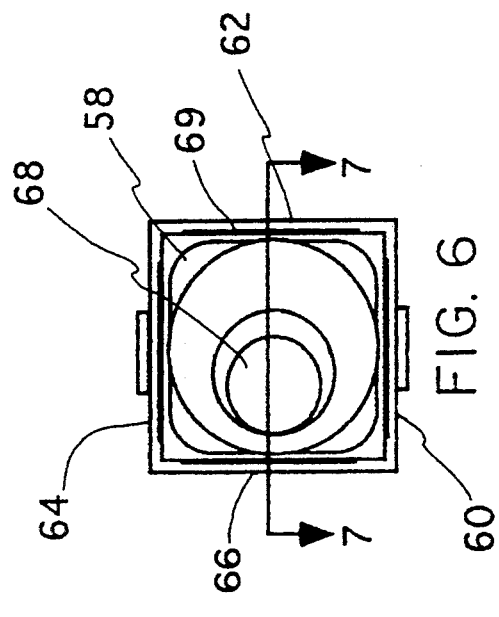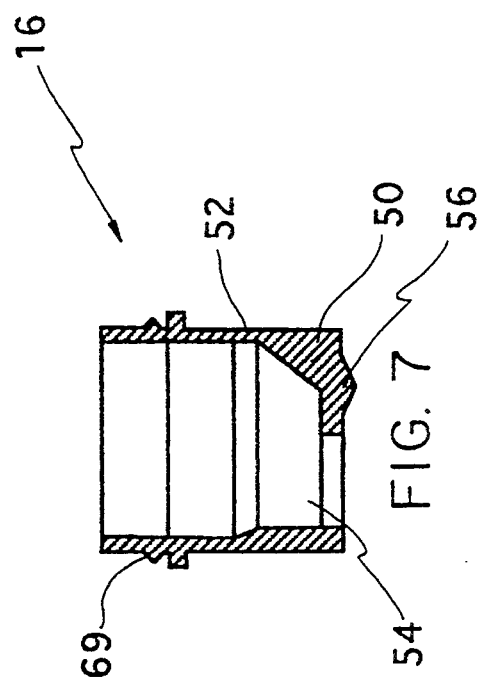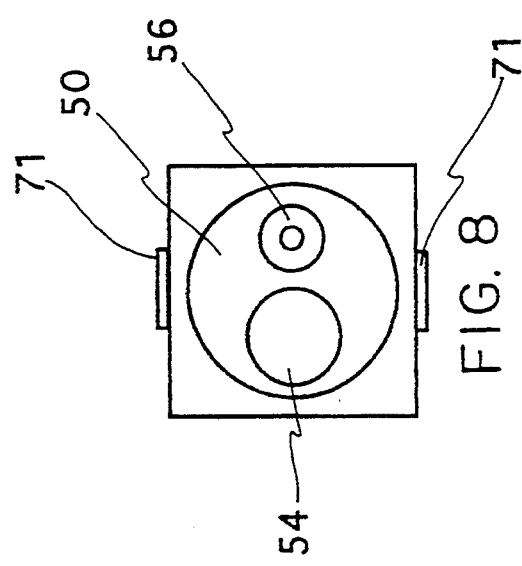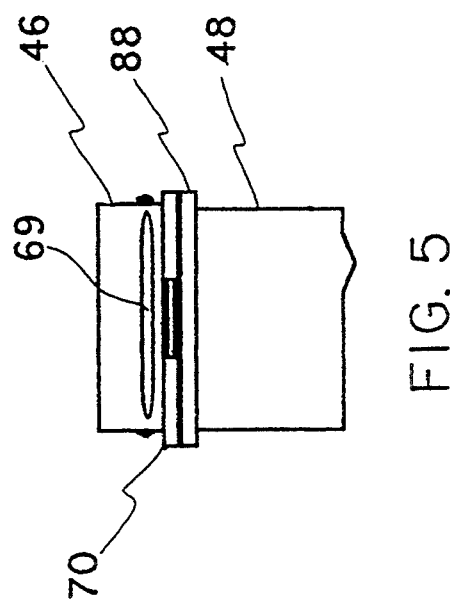

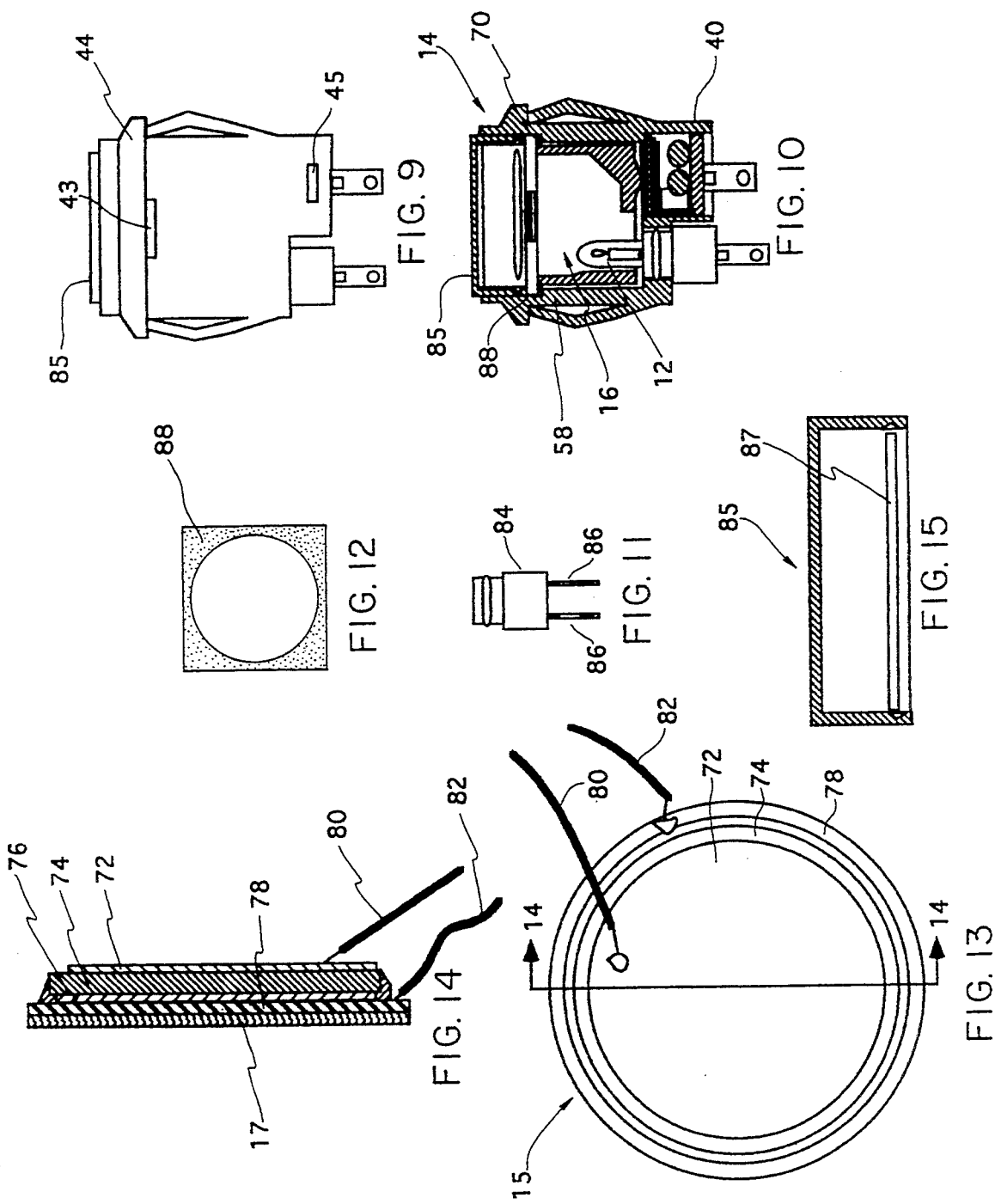

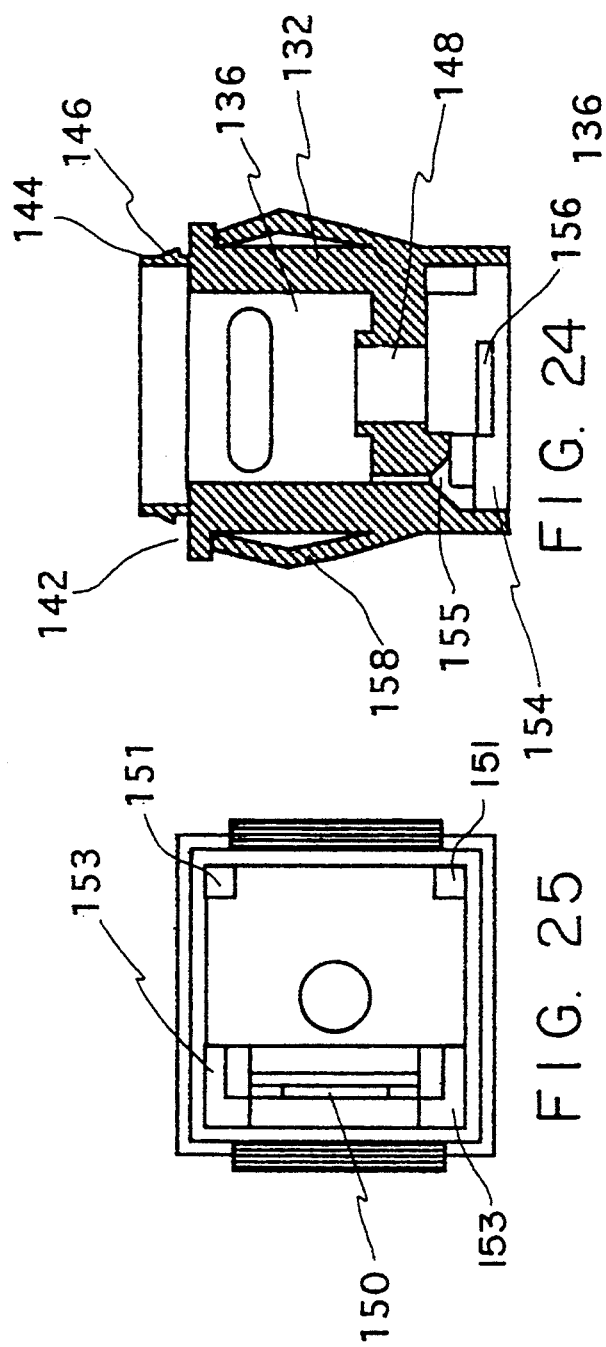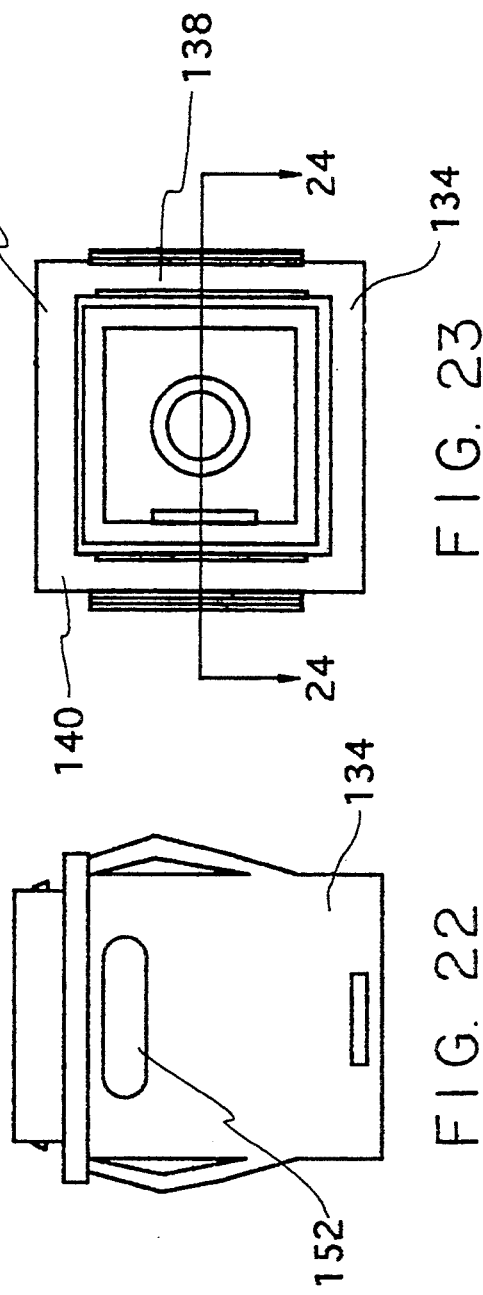

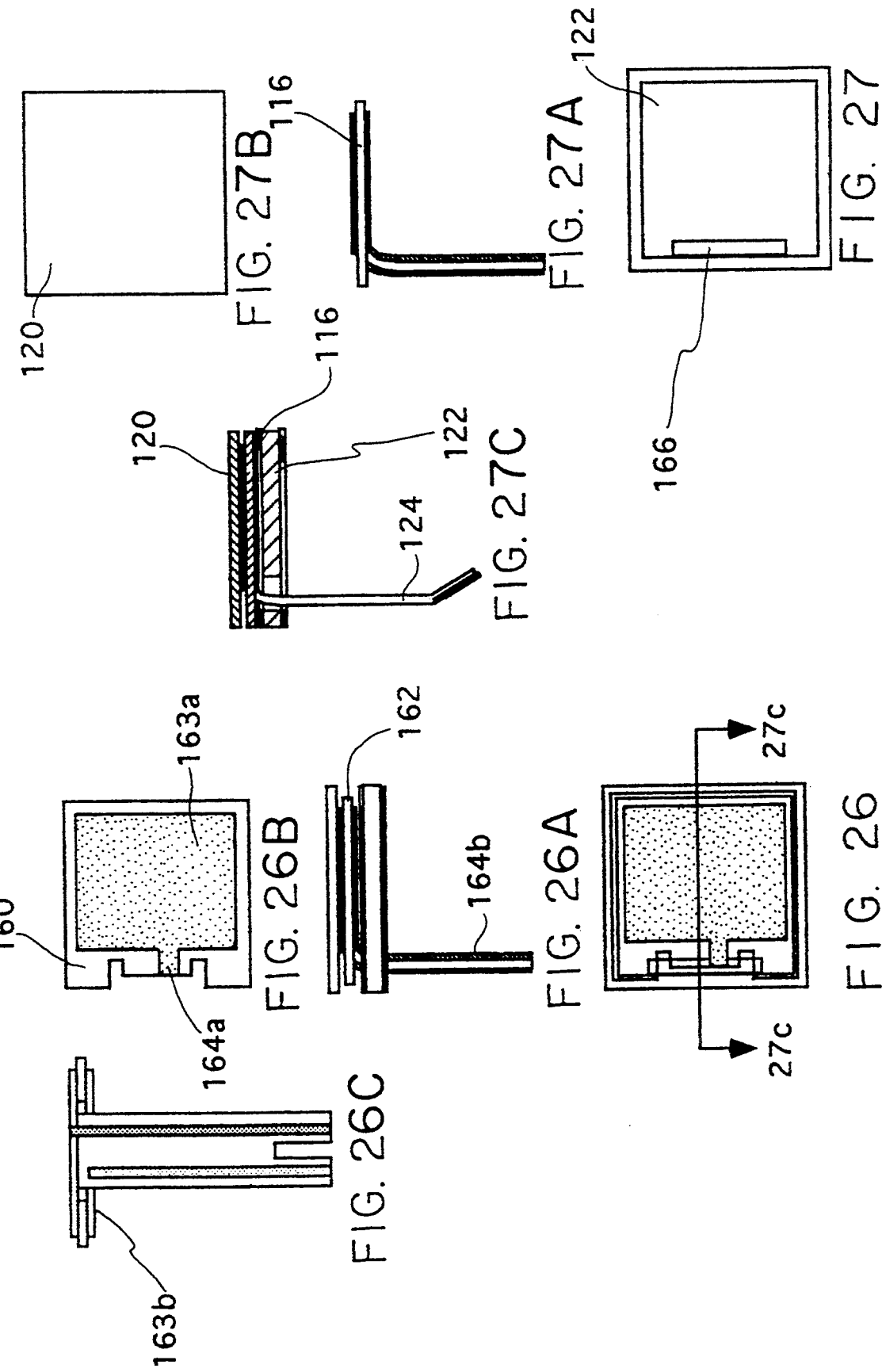

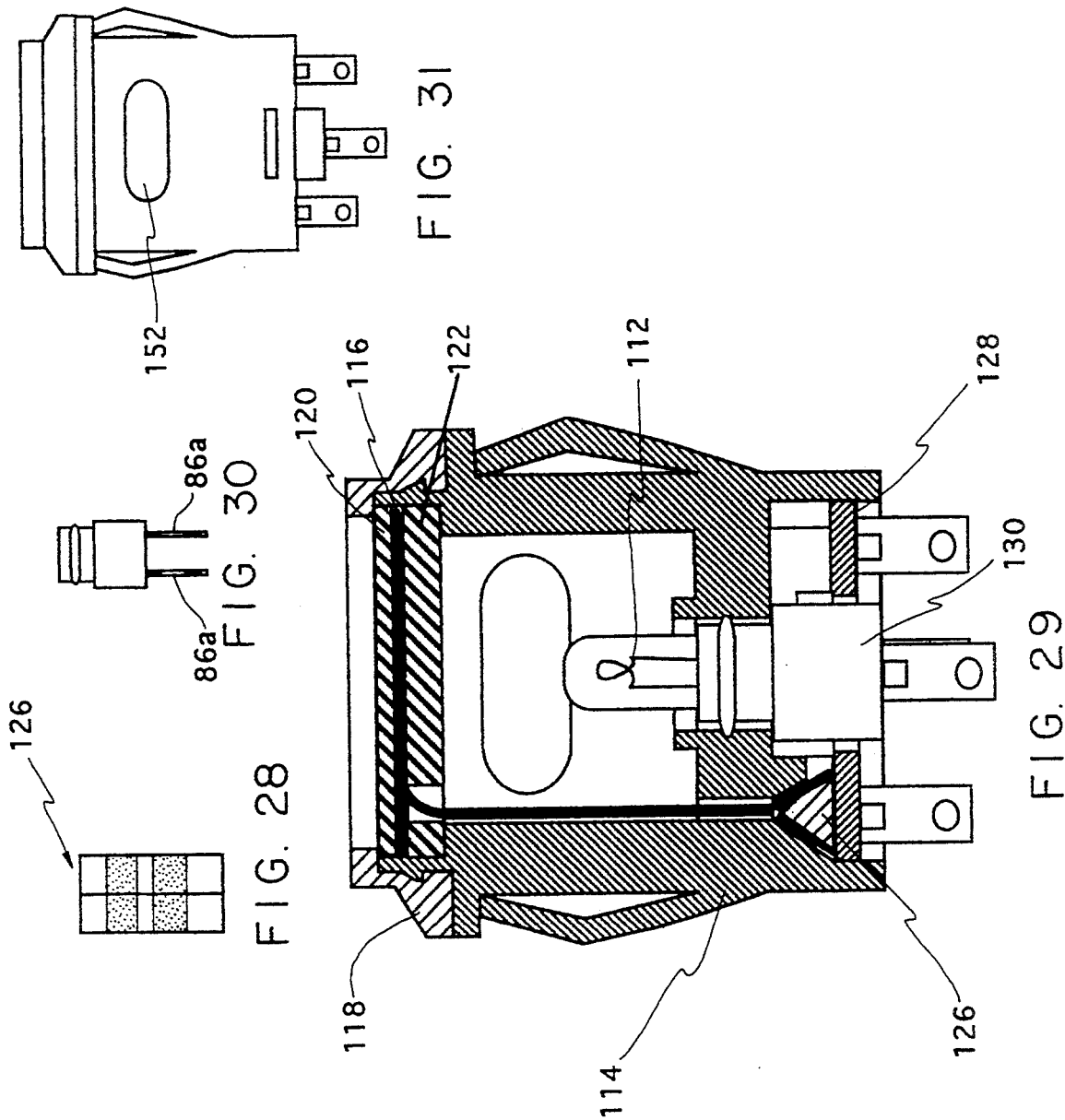

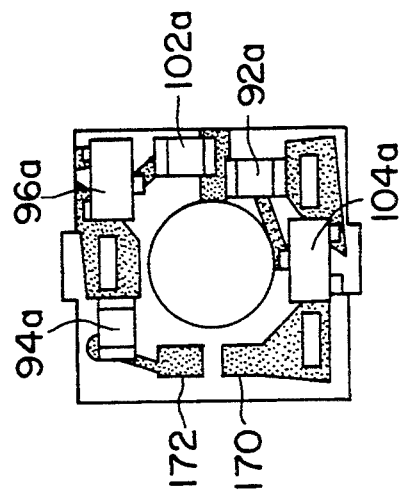
FIG. 33
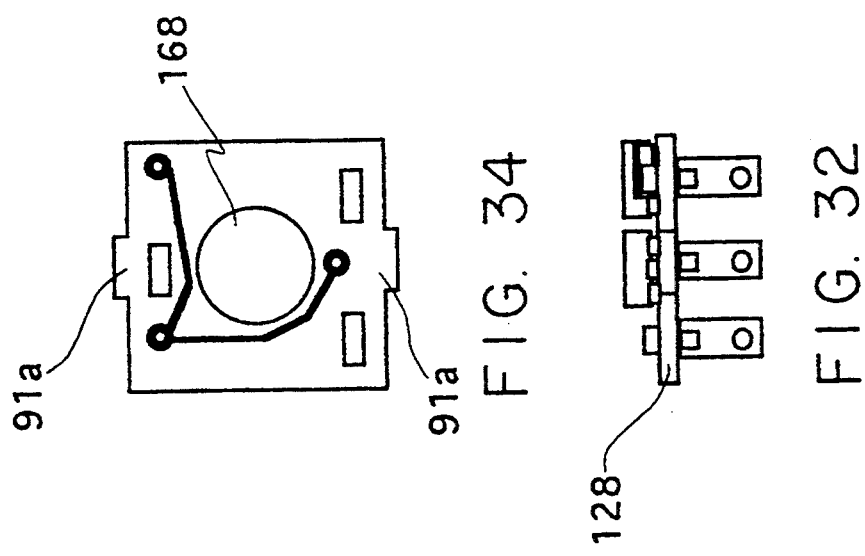
FIG. 34
FIG. 32

PIEZO ELECTRIC SWITCH

BACKGROUND OF THE INVENTION

Field of the Invention

This invention relates to a piezo electric switches. The inventor has two patents issued on piezo electric switches namely, U.S. Pat. Nos. 5,214,256 and 5,216,316.

SUMMARY OF THE INVENTION

The invention disclosed herein is directed at a embodiments of a piezo electric switch having a combination of a lamp, a housing, a piezo element, a printed circuit board assembly, a lamp housing and a plunger and a second embodiment of a piezo electric switch having a combination of lamp element, a housing portion, a piezo film element, a bezel, a graphic overlay, a translucent diffuser backer, a connector being a laminate of layers of conductive and non conductive rubber, a printed circuit board assembly, and a lamp housing. A variation of the first embodiment utilizes a peizo tape.

BRIEF DESCRIPTION OF THE DRAWINGS

Further details are explained below with the help of the example(s) illustrated in the attached drawings in which:

FIG. 5 is a side elevational view of the plunger according to the present invention;

FIG. 6 is a top plan view of the plunger according to the present invention;

FIG. 7 is a section of the plunger taken on line 7—7 of FIG. 6;

FIG. 8 is a bottom plan view of the plunger according to the present invention;

FIG. 9 is a side elevational view of the switch assembly according to the present invention;

FIG. 10 is a section of the switch assembly shown in FIG. 9;

FIG. 11 is a side elevational view of the lamp mounting with terminals according to the present invention;

FIG. 12 is a top plan view of the gasket according to the present invention;

FIG. 13 is a top plan view of the piezo element with wires attached according to the present invention;

FIG. 14 is a section of the piezo element taken on line 14—14 of FIG. 13;

FIG. 15 is a section of the cap according to the present invention;

FIG. 22 is a side elevational view of the variation housing shown in FIG. 21;

FIG. 23 is a top plan view of the housing shown in FIG. 21;

FIG. 24 is a section of the housing taken on line 24—24 of FIG. 23;

FIG. 25 is a bottom plan view of the housing shown in FIG. 21;

FIG. 26 is a top plan view of the translucent piezo film element, the graphic overlay, and the translucent diffuser backer shown in FIG. 21;

FIG. 26a is a side elevational view of the translucent piezo film element, the graphic overlay, and the translucent diffuser backer shown in FIG. 21;

FIG. 26b is a bottom plan view of the translucent piezo film element, the graphic overlay, and the translucent diffuser backer shown in FIG. 21;

FIG. 26c is a front elevation of the translucent piezo film element, the graphic overlay, and the translucent diffuser backer shown in FIG. 21;

FIG. 27 is a top plan view of the translucent diffuser backer shown in FIG. 21;

FIG. 27a is a sectional, side elevational view of the translucent diffuser backer and the piezo film element shown in FIG. 26a;

FIG. 27b is a plan view of the graphic overlay shown in FIG. 21;

FIG. 27c is a sectional, side elevational view of the translucent diffuser backer, the graphic overlay and the piezo film element shown in FIG. 26a;

FIG. 28 is a side elevational view of the laminate of layers of conductive and non conductive rubber connector shown in FIG. 21;

FIG. 29 is an exploded sectional, side elevational view of the variation of the switch assembly according to the present invention;

FIG. 30 is a side elevational view of the lamp mounting with terminals to be used with the variation according to the present invention;

FIG. 31 is a side elevational view of the variation of the switch assembly according to the present invention;

FIG. 32 is an elevational view of the printed circuit board used with the variation according to the present invention;

FIG. 33 is a top plan view of the printed circuit board used with the variation according to the present invention;

FIG. 34 is a bottom plan view of the printed circuit board used with the variation according to the present invention;

DESCRIPTION OF THE PREFERRED EMBODIMENT(S)

Figure 2:
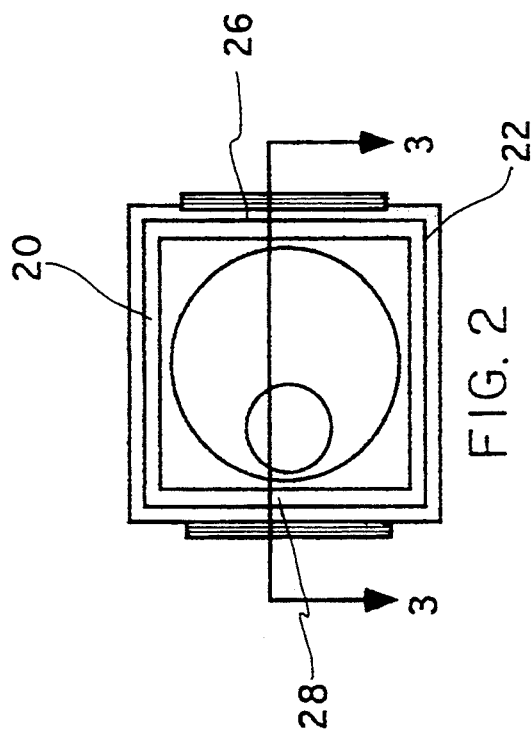
FIG. 2 is a top plan view of the housing according to the present invention.

There is shown in the drawings a combination of a lamp 12, a housing 14, a piezo element 15 and a plunger 16.

Figure 3:
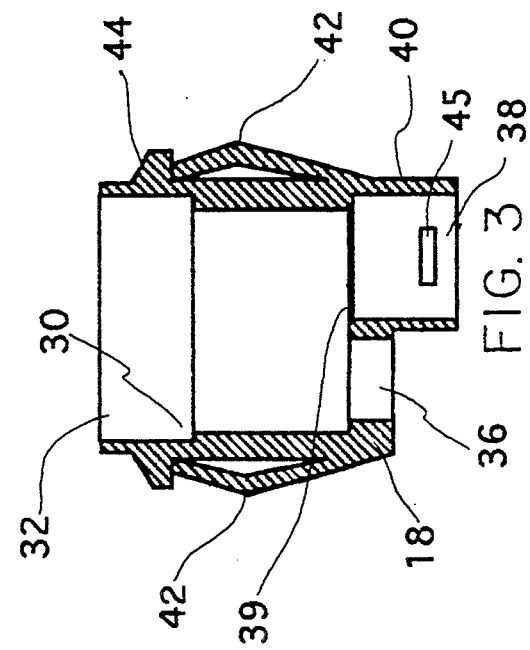
FIG. 3 is a section of the housing taken on line 3—3 of FIG. 2.
Figure 4:
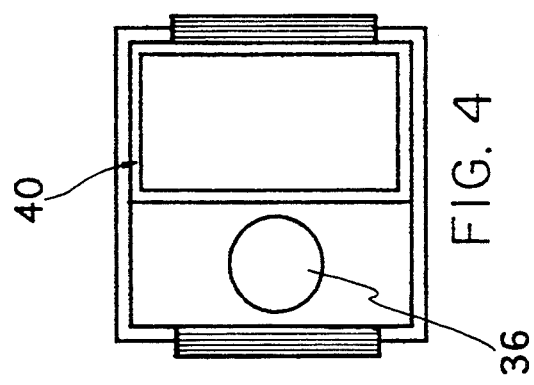
FIG. 4 is a bottom plan view of the housing according to the present invention.
Figure 1:
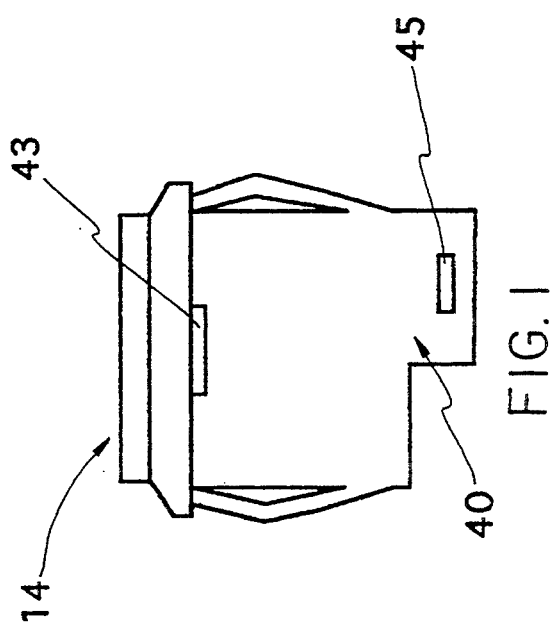
FIG. 1 is a side elevational view of the housing according to the present invention.

The housing 14 has a base 18 which has a first edge, a second edge, a third first short edge and a fourth second short edge. A first side 20 extends integrally from the first edge and a second side 22 extends integrally from the second edge in spaced parallel relation to the first side 20. Third and fourth sides 26, 28 are in right angle relation to and connecting the first and second sides 20, 22 to complete the box like configuration of the housing 14. An interior circumferential shoulder 30 extends integrally from the inner surface of the first, second, third and fourth sides 20, 22 26, 28 positioned on a horizontal plane a predetermined distance from the top 32 within the box like configuration of the housing 14. A first opening 36 is formed through the base 18 as shown in FIG. 3. An integral rectangular sub housing 40 extends from the base 18 terminating on a plane below the termination of the first opening 36. The base 18 is thinned above the sub housing 40 to form an activating wall 39. An integral triangular arm 42 extends from the juncture of the base 18 and the exterior of each of the third and fourth sides 26, 28 terminating under the shoulder formed by an integral, circumferential external shoulder 44 which is formed on the exterior of first, second, third and fourth sides 20, 22 26, 28 at predetermined distances from the top 32. A first slot 43 is centrally, formed through the first and second sides 20, 22 adjacent the external shoulder 44 as shown in FIG. 1. A second slot 45 is formed on each of the sides of the sub housing 40 which correspond to the first and second sides 20, 22.

The plunger 16 is integrally formed of two parts, an upper part 46 and a lower part 48. The lower part 48 comprises a base portion 50 generally circular in configuration. A tubular wall 52 extends integrally from the base portion 50. The tubular wall 52 is open at its upper end and partly closed by the base portion 50. A through aperture 54 is formed in the base portion 50. An actuator 56 extends integrally from the external surface of the base portion 50 as shown in FIG. 7. The upper part 46 comprises a square second base portion 58. First, second, third and fourth walls 60, 62 64, 66 extend from the periphery of the second base portion 58 to provide a box like configuration which is open at the top. A circular second aperture 68 is formed through the second base portion 58, as shown in FIG. 6, opening into the cavity formed by the lower part 48. The ID of the upper part 46 is greater than the OD of the lower part 48. The second base portion 58 forms a shoulder portion 70 with the tubular wall 52. Tabs 71 extend centrally from the shoulder portion 70 of the walls 60, 62 as shown in FIGS. 6 and 8.

The disk like ceramic piezo electric element 15 comprising a series of concentric disks that are placed one on top of the other as shown in FIGS. 13 and 14. The first disk 72 is formed of a silver ink and is abutted to a second disk 74 of ceramic material,. The second disk 74 is of slightly greater diameter than the first disk 72. A third disk 76 also formed of a silver ink and is abutted to the other side of the second disk 74 of ceramic material. As shown in FIG. 14, the second disk 74 is sandwiched between the first disk 72 and the third disk 76. The third disk 76 is then adhered to a fourth disk 78 of copper, which has a larger diameter than any of the other disks. A double sided adhesive tape 17 is adhered to the periphery of the exposed surface of the fourth disk 78 as partially shown in FIGS. 14 and 17. A first wire 80 is electrically attached to the first disk 72 and a second wire 82 is electrically attached to the fourth disk 78, all as shown in FIGS. 13 and 14.

The lamp 12 is positioned in a mounting 84 which is tubular in configuration and has slots formed through its bottom surface to place a pair of terminals 86 in spaced parallel relation with each other. The lamp 12 is mounted electrically and physically between the terminals 86.

Figure 10A:
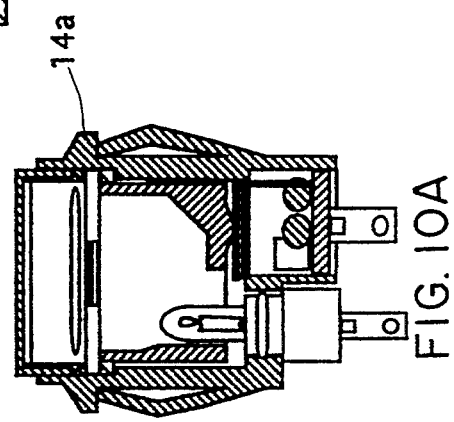
FIG. 10A is a section of the switch assembly showing a variant method of mounting the piezo element and the printed circuit board.

After the gasket 88 is circumscribed around the lower part 48 of the plunger 16 as shown in FIG. 5, the plunger 16 is mounted within the housing 14, by passing the lower part 48 of the plunger 16 into the cavity of the housing 14 until the shoulder portion 70 with its attached gasket 88, abuts the interior circumferential shoulder 30 and the Tabs 71 are passed through the slots 43. The actuator 56 abuts the activating wall 39 as shown in FIG. 10. The subassembly of the lamp 12 and the terminals 86 is pressed into the first opening 36 with the lamp 12 extending into the cavity of the plunger 16 and the terminals 86 extending outside the housing 14 as shown in FIG. 10. The lamp 12 can then be hooked to a DC power supply (not shown) and left on. Since the customer can use the lamp 12 in several ways electrically, it is not contemplated to electrically hook up the lamp 12.

Figure 17:
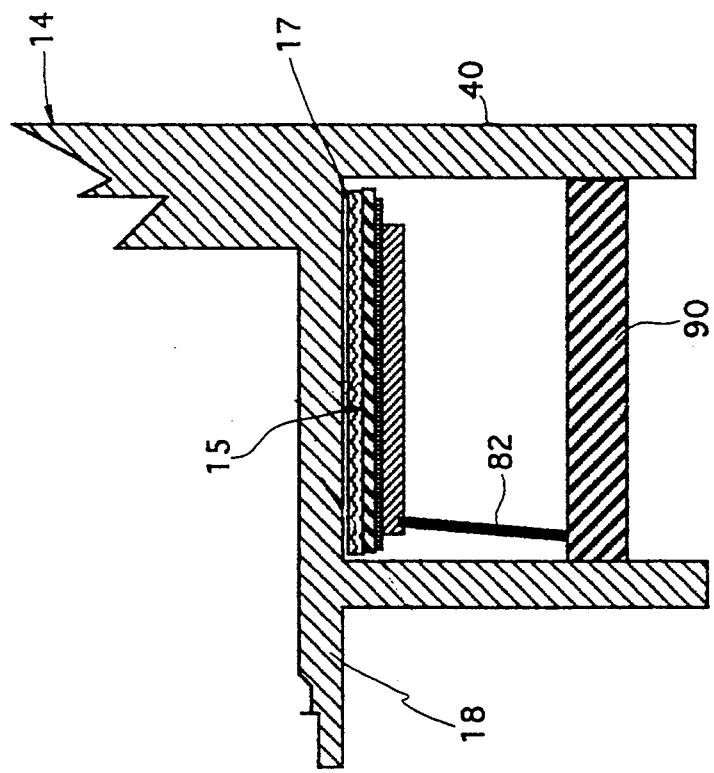
FIG. 17 is an exploded broken off section of the housing showing a method of mounting the piezo element and the printed circuit board.

As is shown in FIG. 17, the piezo electric element 15 is mounted in the sub housing 40 by adhering the attached adhesive disk 17 to the under surface of the activating wall 39. The wires 80, 82 are connected to a printed circuit board 90 which is fixed in the sub housing 40 below the piezo electric element 15. The printed circuit board 90 is connected to the walls of the subassembly 40 by passing the tabs 91 which extend from the short sides of the printed circuit board 90 through the second slots 45, as shown in FIG. 17.

Figure 19:
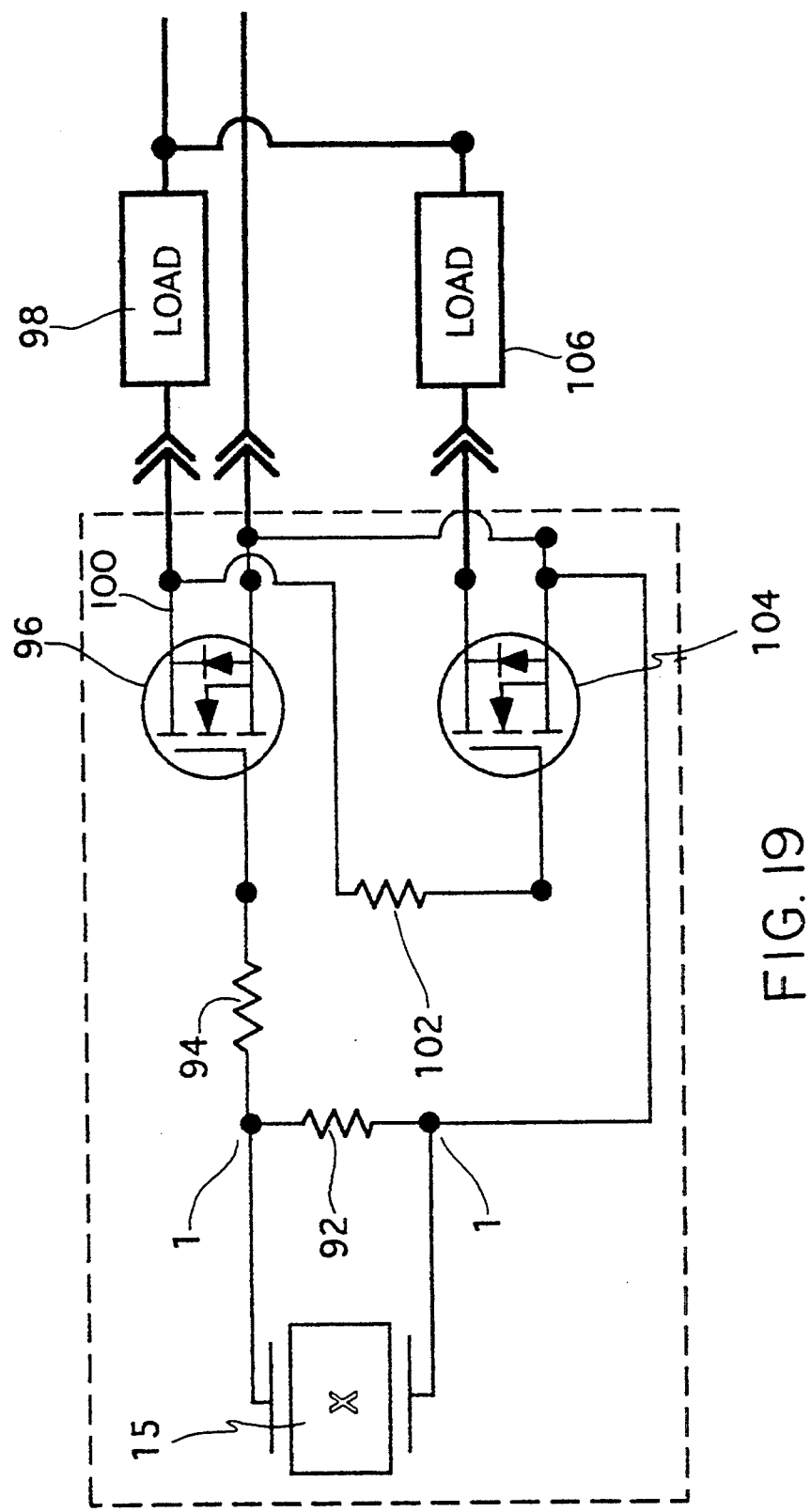
FIG. 19 is an electrical schematic of the printed circuit board according to the present invention.

The piezo electric element 15 is connected to the printed circuit board 90 which contains the electronic circuit of the device that is best shown in the schematic of FIG. 19. There is shown a piezo electric element 15 whose wires 80, 82 are in parallel and which have a high value resistor 92 connected there across, as shown in FIG. 19. The high value resistor 92 is connected to a current limiting gate resistor 94 which in turn is connected to the gate of a normally off transistor 96. If the piezo electric element 15 is deflected by pressure applied to the actuator 56 a voltage is caused and the transistor 96 will be momentarily turned on activating the first load 98, which may be an indicator light or the like. The drain 100 of the transistor 96 is connected to a current limiting second gate resistor 102. The high voltage appearing at the drain of transistor 96 will appear at the second gate resistor 102 which in turn passes it on to the gate of the normally on second transistor 104 turning it off stopping current to the second load 106. When the voltage to the transistor 96 dies down, causing the voltage at the drain 100 to rise, turning on the second transistor 104 and the second load 106. The load could be any electric element. The piezo electric element 15 is connected to the printed circuit board by attaching the wires 80, 82 to pads (not shown).

Figure 20:
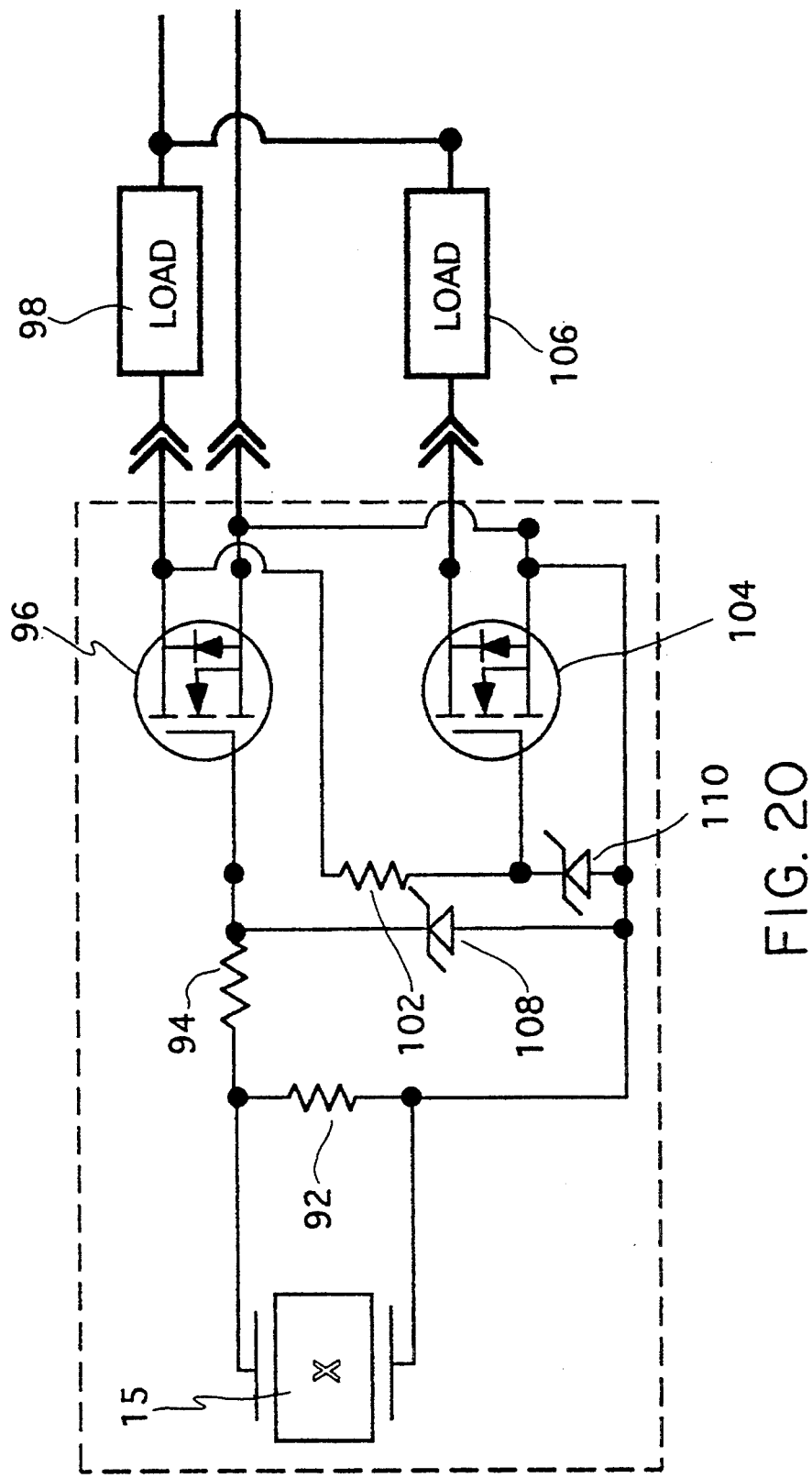
FIG. 20 is a variant electrical schematic of the printed circuit board according to the present invention.

Another method of connecting the electrical elements to the piezo electric element 15 is shown in FIG. 20. The schematic shown in FIG. 20 is identical with that of FIG. 19 except that two zener diodes have been added to FIG. 20. The first zener diode 108 is connected as shown to prevent a transient pulse from burning out transistor 96. The second zener diode 110 is connected as shown to prevent a transient pulse from burning out second transistor 104.

Figure 18:
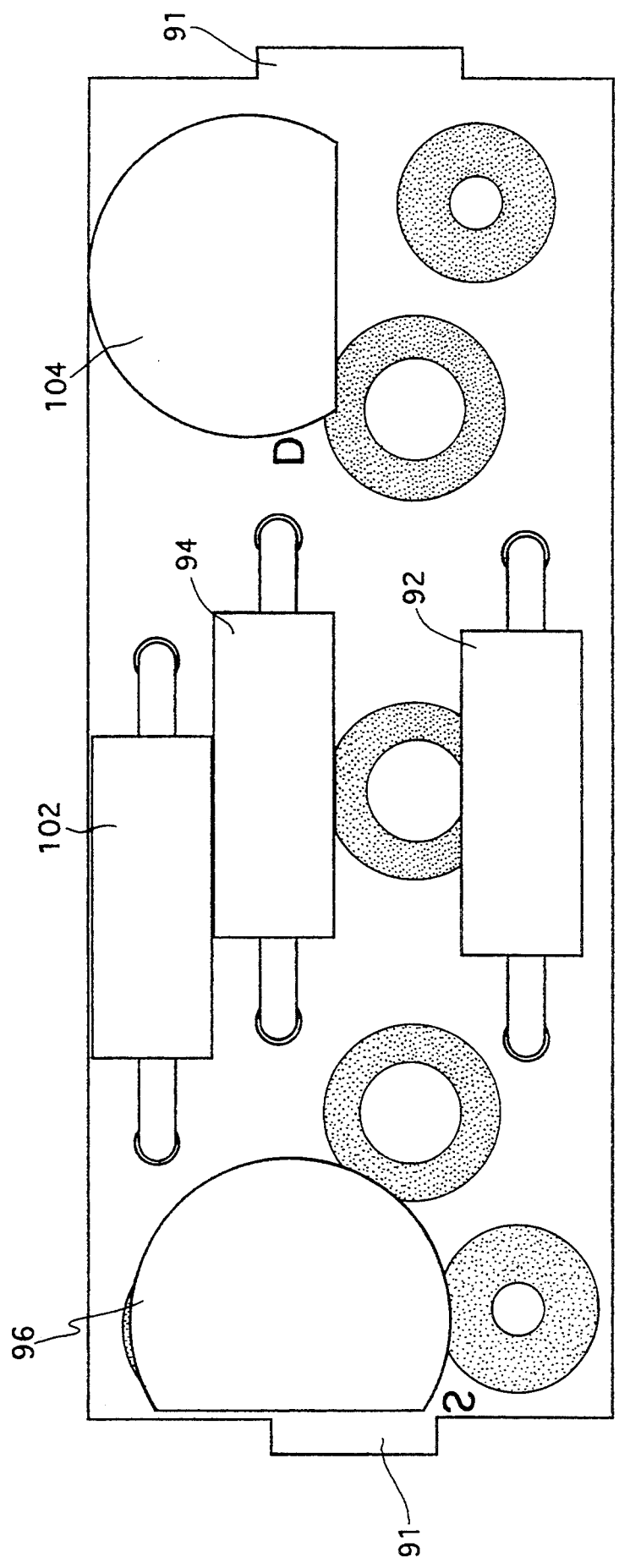
FIG. 18 is a top plan view of the printed circuit board according to the present invention.

Some of the elements mounted on the printed circuit board 90 are on one face of the printed circuit board 90, as shown by FIG. 18 (i.e. the mounting of the transistor 96, the second transistor 104, and the resistors 92, 94 and 102).

As shown in FIGS. 10 and 15, the clear plastic lens or cap 85 is engaged to the plunger 16 when the ribs 69 of the plunger 16 engages the grooves 87 of the cap 85 as shown in FIGS. 5, 6, 7 and 10. It is when pressure by a human agent, for example, is applied to the cap 85 that the plunger 16 is moved downwardly to cause the actuator 56 to bear against the activating wall 39 of the base 18 deflecting the piezo electric element 15. In this embodiment, the piezo electric element 15 is mounted on the lower surface of the activating wall 39 of the base 18 as shown in FIG. 17.

Figure 16:
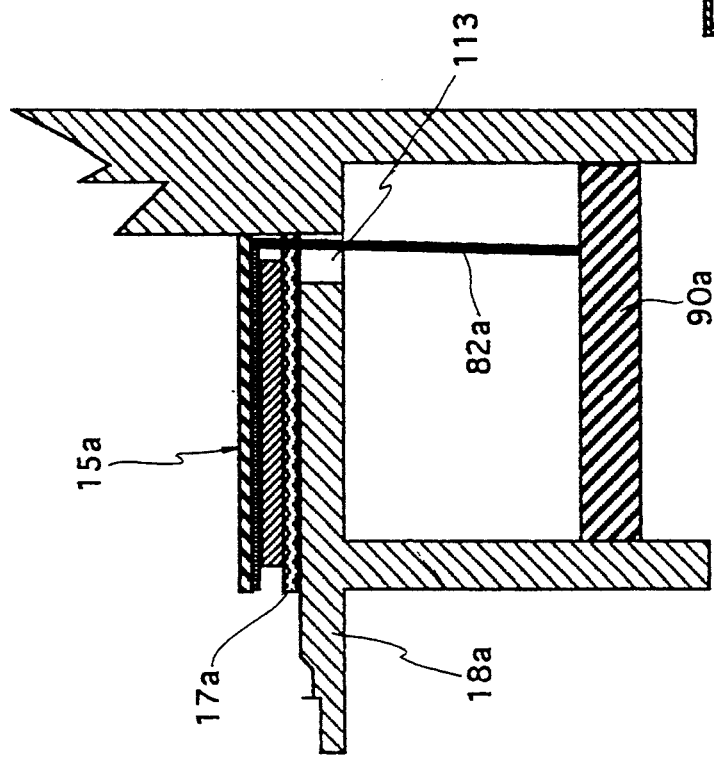
FIG. 16 is an exploded broken off section of the housing showing a variant method of mounting the piezo element and the printed circuit board.

A variation for mounting the piezo electric element 15a to the top surface of the base 18a of the housing 14a is shown in FIG. 16. With the exception of the elements shown in FIG. 16 all elements of the device remain the same as in the original embodiment. In the variation, a through hole 113 is formed in the base 18a at what is equivalent to the activating wall 39. In this case the circular adhesive disk 17a may be adhered to the first disk 72. The wires (82a being shown, 80a not shown) are passed through the hole 113 and are then attached to the printed circuit board 90a in the same manner as the wires 80 and 82 were attached to the printed circuit board 90 by pads 1. In this case as shown FIG. 10A the actuator 56 of the plunger 16 bears directly on the piezo electric element 15a.

A variation of the assembly is shown in FIGS. 21–35. There is shown in the drawings, a combination of a lamp element 112, a housing portion 114, a piezo film element 116, a bezel 118, a graphic overlay 120, a translucent diffuser backer 122, a laminate of layers of conductive and non conductive rubber connector 126, a printed circuit board assembly 128, and a lamp housing 130.

Figure 21:
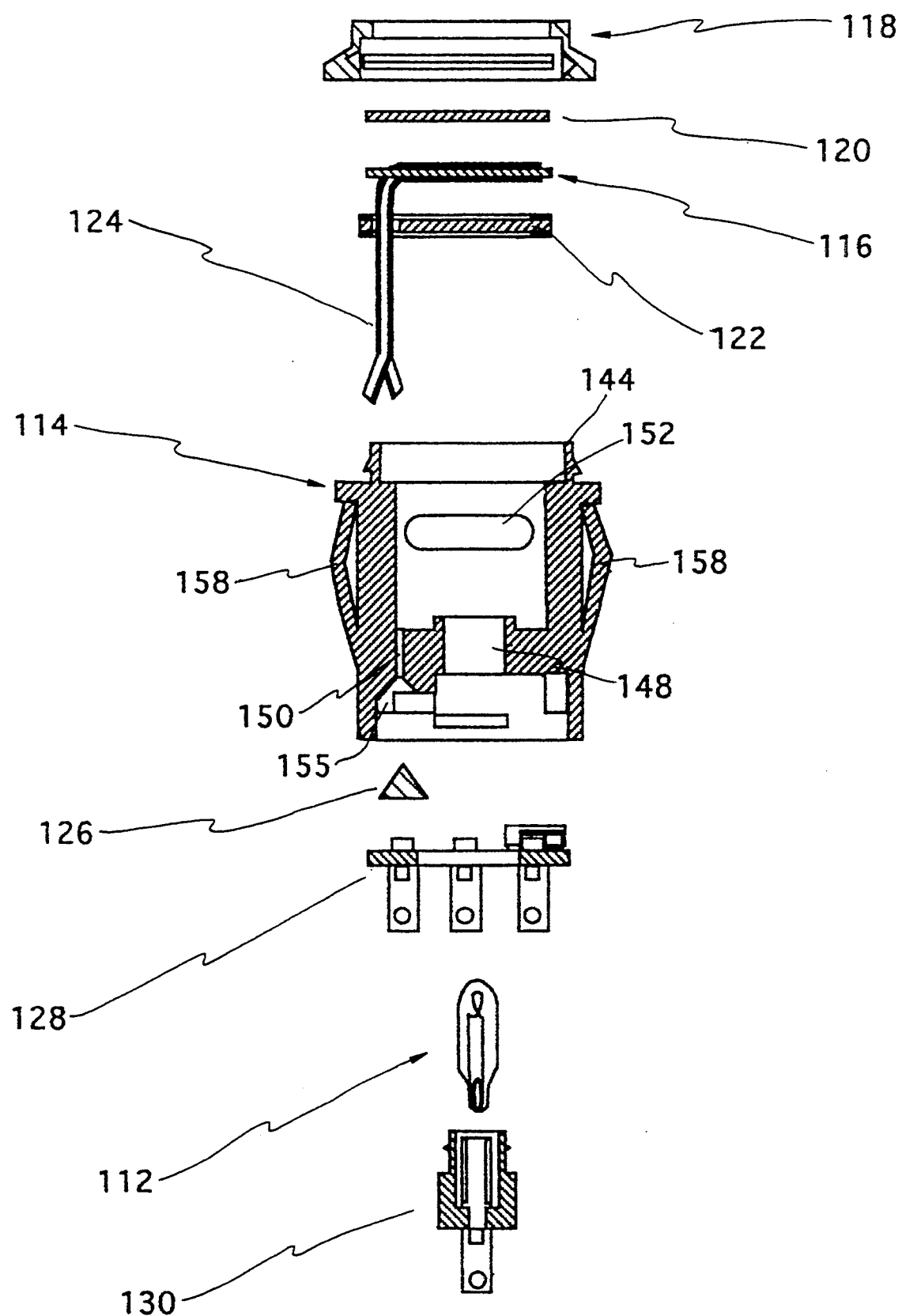
FIG. 21 is an sectional exploded view of a variation of the switch assembly according to the present invention.

The housing portion 114 has a foundation portion 132 which has a first edge, a second edge, a third first short edge and a fourth second short edge. A first side wall 134 extends integrally from the first edge and a second side wall 136 extends integrally from the second edge in spaced parallel relation to the first side wall 134. Third and fourth sides walls 138, 140 are in right angle relation to and connecting the first and second side walls 134, 136 to complete the box like configuration of the housing 114. The housing 114 is open at the top which is defined by a top surface 142. A rectangular bezel engagement portion 144 extends upward from the top surface 142. Bezel engagement tabs 146 extend from two of the walls of the bezel engagement portion 144 as shown in FIGS. 22 and 24. A first through hole 148 is formed through the foundation portion 132 as shown in FIG. 23. A second hole 150 of much smaller diameter than the first hole 148 is formed through the foundation portion 132 spaced from the first hole 148 as shown in FIG. 23. A through vent 152 is formed in the walls 134 and 136. An integral, open, rectangular housing portion 154 extends from the foundation portion 132 terminating on a plane below the termination of the first hole 148. A wedge shaped shallow hole 155 is positioned directly below and opening into the second hole 150. Within this same area four printed circuit board stand-offs are formed. Two stand offs 151 are merely posts while two are L shaped stand offs 153 which assist in holding the laminate of layers of conductive and non conductive rubber connector 126. An engagement slot 156 is formed in the walls 134 and 136 spaced from the vents 152 as shown in FIGS. 21, 23. An integral triangular engagement arm 158 extends from the juncture of the foundation portion 132 and the exterior of each of the third and fourth walls 138, 140 terminating under the shoulder formed by an integral, extension of the top surface 142 as shown in FIG.

The translucent piezo film element 116 is formed of a polyvinylidine fluoride having a first side 160 and a second side 162. Both the first and second sides 160, 162 are coated with a current carrying material, indium tin oxide, which forms a pad 163a from which a first trace 164a extends on the first side 160 and which forms a pad from which a second trace 164b extends on the second side 162 as shown in FIGS. 26–27c. A portion of the assembly of the polyvinylidine fluoride and its coatings of indium tin oxide 164a, 164b is bent downward to form a tail portion 124. The tail portion 124 is slit as shown in FIG. 26c for a purpose to be explained hereinafter. The translucent diffuser backer 122 includes a tail engaging slot 166. The tail portion 124 is passed through the tail engaging slot 166 of the translucent diffuser backer 122 and the remaining part of the piezo film element 116 is adhered to the translucent diffuser backer 122 as shown in FIG. 26b. The graphic overlay 120 is adhered to piezo film element 116 as shown in FIGS. 27c and 29.

The laminate of layers of conductive and non conductive rubber connector 126 connects the piezo film element 116 and the printed circuit board 128. FIG. 28 shows a side elevation of the conductive and non conductive rubber connector 126 with its alternating conductive and non conductive layers.

Figure 35:
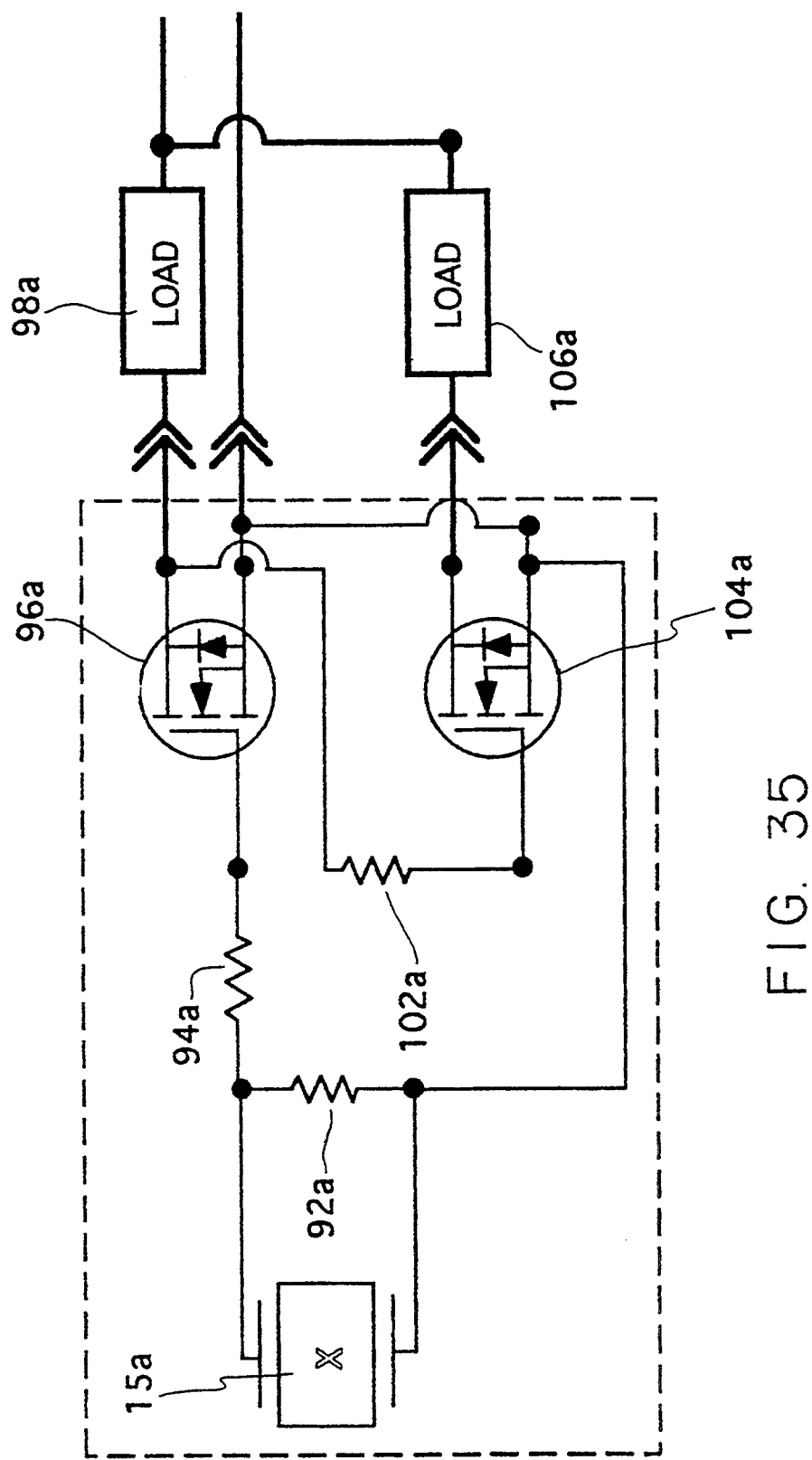
FIG. 35 is an electrical schematic of the printed circuit board used with the variation according to the present invention.

The printed circuit board 128 which contains the electronic circuit of the variation is shown in the schematic of FIG. 35 and in FIGS. 32–34. There is shown a piezo electric element 15a whose wires are in parallel and which have a high value resistor 92a connected there across, as shown in FIG. 35. The high value resistor 92a is connected to a current limiting gate resistor 94a which in turn is connected to the gate of a normally off transistor 96a. If the piezo electric element 15a is deflected by pressure applied to the piezo film element 116 a voltage is caused and the transistor 96a will be momentarily turned on activating the first load 98a, which may be an indicator light or the like. The drain of the transistor 96a is connected to a current limiting second gate resistor 102a. The high voltage appearing at the drain of transistor 96 will appear at the second gate resistor 102a which in turn passes it on to the gate of the normally on second transistor 104a turning it off stopping current to the second load 106a. When the voltage to the transistor 96a dies down, causing the voltage at the drain 100a to rise, turning on the second transistor 104a and the second load 106a. The load could be any electric element. The piezo electric element 15a is connected to the printed circuit board by pads 170, 172. piezo electric element 15a. A lamp housing engaging hole 168 is centrally formed through the printed circuit board assembly 128.

To assemble the device, the subassembly of the translucent diffuser backer 122, piezo film element 116 and the graphic overlay 120 is positioned on the shoulder formed by the top surface 142 and the rectangular bezel engagement portion 144 by adhesive or the like. The tail portion 124 is passed through the tail engaging slot 166 of the translucent diffuser backer 122 and down through the second hole 150 as shown in FIG. 29. The bezel 118 is snap attached through grooves formed on two inner walls of the bezel 118 to the bezel engagement tabs 146 extend from two of the walls of the bezel engagement portion 144. The split ends of the tail portion 124 are separated so that the coatings of indium tin oxide 164a, 164b each bear against one of the conductive layers of the conductive and non conductive rubber connector 126 which has been pushed against the split ends of the tail portion 124 as shown in FIG. 29. The printed circuit board 128 is snap engaged to the housing 114 by passing the tabs 91 a which extend from the short sides of the printed circuit board 128 through the engagement slots 156. The printed circuit board 128 abuts the conductive and non conductive rubber connector 126 further securing its engagement with the split ends of the tail portion 124. The lamp 112 is pressed into the subassembly of the terminals 86a and the lamp housing 130. The subassembly of the lamp 112, the terminals 86a and the lamp housing 130 is push up into the lamp housing engaging hole 168. The lamp 112 will illuminate the piezo film element 116 and any cap that may be used. The lamp 112 can then be hooked to a DC power supply (not shown) and left on. Since the customer can use the lamp 112 in several ways electrically, the lamp 112 is not contemplated to be electrically hooked up. the first opening 36 with the lamp 12 extending into the cavity of the plunger 16 and the terminals 86 extending outside the housing 14 as shown in FIG. 10. The device may now be used with other electrical devices through the three terminals without numbers.

What I claim is:

1. A piezo electric switch including, a housing, a lamp mounted within the housing, a piezo element and a plunger, the housing comprising a base having a first edge, a second edge, a third edge and a fourth edge, a first side extending integrally from the first edge, a second side extending integrally from the second edge and in spaced parallel relation to the first side, third and fourth sides, extending from the respective third and fourth edges and wherein each third and fourth side is connected to the first and second sides whereby the base and the first, second, third and fourth sides define a box like configuration of the housing, the first, second, third and fourth sides each having an inner surface and a top portion spaced from the base, an interior circumferential shoulder extending integrally from the inner surface of the first, second, third and fourth sides and positioned on a plane at a distance from the top portion within the box like configuration of the housing, a first circular opening formed through the base for receiving the lamp and a second opening of larger diameter than a diameter of the first opening is formed through the base adjacent the first opening and separated therefrom, an integral rectangular subhousing extending from the base, positioned adjacent the second opening and terminating on a plane adjacent a termination of the first opening, a first pair of slots are centrally formed through respective first and second sides adjacent an external shoulder, a second pair of slots are formed on respective opposite sides of the subhousing and adapted to receive a circuit board the plunger integrally formed of an upper part and a lower part, the lower part comprising a base portion forming a cavity generally circular in configuration and having an aperture formed therethrough for receiving the lamp, a tubular wall extending integrally from the base portion, the tubular wall has an upper end and a lower end and is open at its upper end and partly closed by the base portion at its lower end, an actuator extending integrally from an external surface of the base portion in close proximity to the aperture, the upper part comprises a rectangular second base portion, first, second, third and fourth walls extending from a periphery of the second base portion to provide a box like configuration having a circular inner surface and open at the top, a circular aperture formed through a lower end of the second base portion and opening into the cavity formed by the lower part, an inside diameter of the upper part is greater than an inside diameter of the lower part, the second base portion forms a shoulder portion with the tubular wall, tabs extending centrally from the shoulder portion of the walls, the piezo element mounted in the sub housing, a gasket circumscribes a lower part of the plunger, and the plunger mounted within the housing with the shoulder portion abutting the interior circumferential shoulder, the tabs passed through the first slots to thereby hold the housing and the plunger together and the actuator positioned above the second opening and positioned to contact the piezo element upon depression of the plunger

* * * * *